US012574018B2

(12) United States Patent
Hollis et al.

(10) Patent No.: US 12,574,018 B2
(45) Date of Patent: Mar. 10, 2026

(54) DISTRIBUTED FEEDBACK IN SCALE UP SIGNAL PATHS

(71) Applicant: Micron Technology, Inc., Boise, ID (US)

(72) Inventors: Timothy M. Hollis, Meridian, ID (US); Chulkyu Lee, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 18/591,581

(22) Filed: Feb. 29, 2024

(65) Prior Publication Data

US 2024/0429905 A1     Dec. 26, 2024

Related U.S. Application Data

(60) Provisional application No. 63/522,331, filed on Jun. 21, 2023.

(51) Int. Cl.
| | |
|---|---|
| *H03K 3/02* | (2006.01) |
| *H03K 3/356* | (2006.01) |
| *H03K 19/0185* | (2006.01) |
| *H03K 19/0944* | (2006.01) |

(52) U.S. Cl.
CPC . *H03K 3/356121* (2013.01); *H03K 19/01855* (2013.01); *H03K 19/0944* (2013.01)

(58) Field of Classification Search
CPC ............ H03K 3/02; H03K 3/027; H03K 3/03; H03K 3/037; H03K 3/356121; H03K 19/00; H03K 19/0175; H03K 19/017545; H03K 19/01825; H03K 19/01855; H03K 19/0944; H03K 19/20; H03K 2005/00013; H03K 2005/0078; H03K 5/06; H03F 1/34
See application file for complete search history.

(56) References Cited

U.S. PATENT DOCUMENTS 7,667,522 B1 *    2/2010    Maung ........... H03K 19/018528
                                                              326/62

* cited by examiner

*Primary Examiner* — Long Nguyen
(74) *Attorney, Agent, or Firm* — Fletcher Yoder, P.C.

(57) ABSTRACT

A device includes a signal path including a plurality of inverters connected in series, which comprises a first inverter having a first input and a having first output, a second inverter having a second input coupled to the first output of the first inverter and having a second output, and a third inverter having a third input coupled to the second output of the second inverter and having a third output. The device also includes a first feedback path connecting the second output of the second inverter to the first input of the first inverter, the first feedback path including a fourth inverter and a second feedback path connecting the third output of the third inverter to the second input of the second inverter, the second feedback path including a fifth inverter.

20 Claims, 3 Drawing Sheets

DISTRIBUTED FEEDBACK IN SCALE UP SIGNAL PATHS

CROSS REFERENCE TO RELATED APPLICATIONS

This application is a Non-Provisional Application claiming priority to U.S. Provisional Patent Application No. 63/522,331, entitled "DISTRIBUTED FEEDBACK IN SCALE UP SIGNAL PATHS", filed Jun. 21, 2023, which is herein incorporated by reference.

BACKGROUND

Field of the Invention

Embodiments of the present disclosure relate generally to the field of semiconductor memory devices. More specifically, embodiments of the present disclosure relate to modifications of signal paths of an electronic device, for example, a memory device.

Description of the Related Art

Generally, electronic devices, such as semiconductor devices, memory chips, microprocessor chips, image chips, and the like, may include one or more signal paths. These signal paths can transmit data signals, clock signals, and the like. However, as signals are transmitted along the signal paths of an electronic device, degradation of the signal can occur. Likewise, in certain situations, scaling up of the signal strength may additionally and/or alternatively be desired. To alleviate this degradation and/or to provide for increase of signal strength of a signal in an electronic device, boosting of the signal strength may be undertaken. However, errors in the data can be introduced when boosting of the signal is undertaken.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electronic devices include any number of signal paths that allow for transmission of respective signals (e.g., clock signals, data signals, etc.). Similarly, there are situations in which it may be desirable to scale-up (e.g., provide bandwidth scaling of) the signal being transmitted along a signal path (i.e., increasing an amount of current available to drive or slew a capacitance at a particular speed along the signal path). One technique to scale-up the signal being transmitted along a signal path is to utilize an inverter chain along the signal path. However, inclusion of an inverter chain along the signal path can introduce errors into the signal being transmitted along the path, for example, inter symbol interference (ISI) errors in the signal. Accordingly, in some embodiments, a feedback path may be introduced into the inverter chain to reduce signal errors, such as ISI. However, in other embodiments, use of multiple feedback paths disposed throughout the inverter chain can be implemented to further reduce signal errors in the scaled-up signal.

Figure 1:
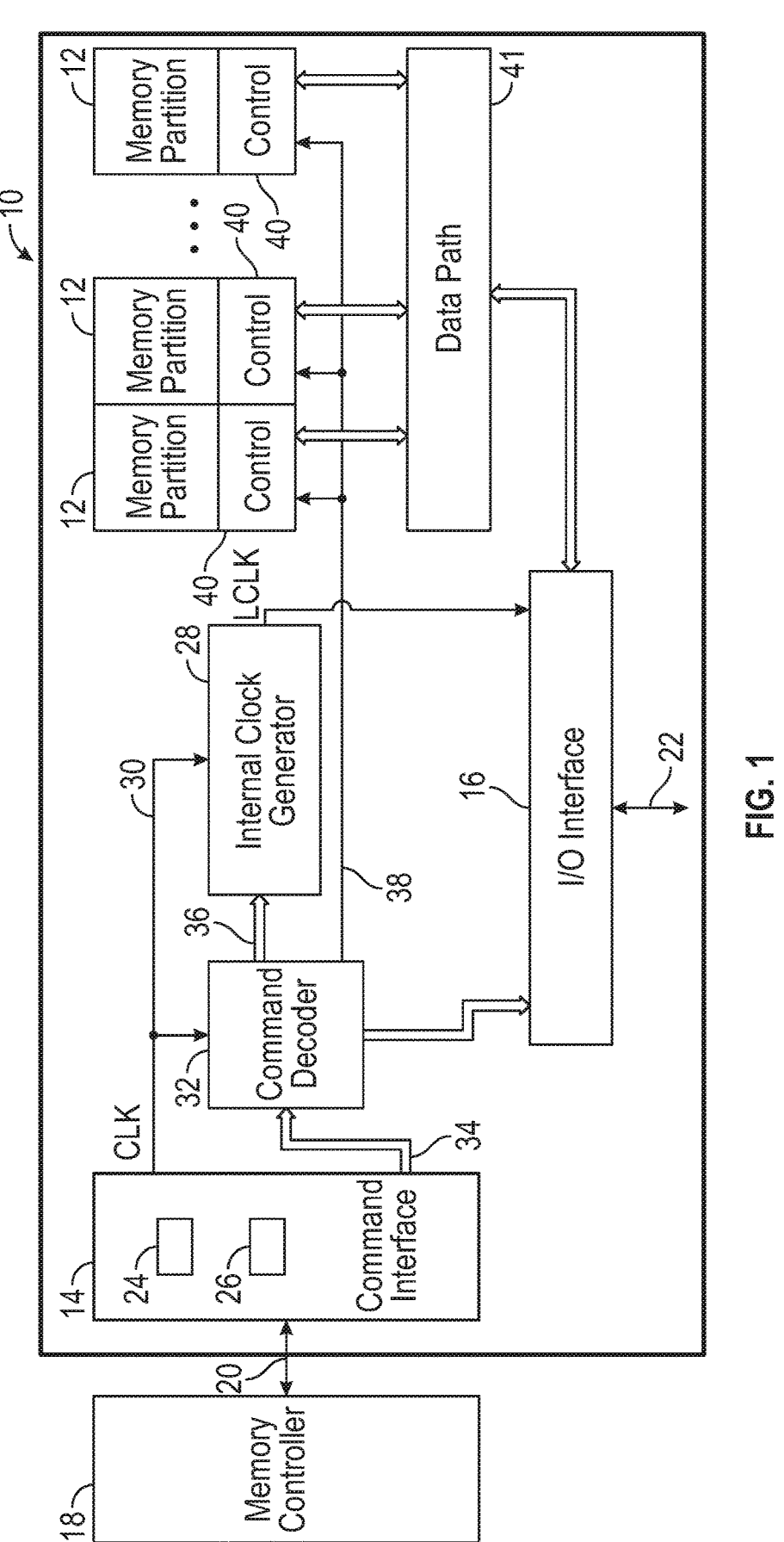
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a random access memory (RAM) device, a dynamic RAM (DRAM) device, a static RAM (SRAM) device (including a double data rate SRAM device), flash memory, a double data rate type four synchronous dynamic random access memory (DDR4 SDRAM) device, a double data rate type five synchronous dynamic random access memory (DDR5 SDRAM) device, or a NAND memory device. While a memory device 10 is described herein, it should be noted that alternate electronic devices, for example, application specific integrated circuits, can be utilized in place of memory device 10. Indeed, the techniques and devices described herein with respect to scale-up of signals can be applied to any electronic device that implements scale-up of a signal along a signal path.

The memory device 10 may include a number of memory partitions 12 each inclusive of one or more arrays (i.e., memory arrays). Various configurations, organizations, and sizes of the memory partitions 12 on the memory device 10 may be utilized depending on the application and design of the overall system. The memory device 10 may also include a command interface 14 and an input/output (I/O) interface 16. The command interface 14 is configured to provide a number of signals from an external device, such as a processor or controller (e.g., memory controller 18) external to the memory device 10. In some embodiments, a bus 20 (or a signal path or another group of signal paths) may, individually or in combination, allow for bidirectional transmission of signals between the command interface 14 and the processor or controller (e.g., the memory controller 18). Likewise, a bus 22 (or a signal path or another group of signal paths) may, individually or in combination, allow for bidirectional transmission of signals, including, for example, data signals, between the I/O interface 16 and, for example, the processor or controller (e.g., the memory controller 18). Thus, the processor or controller, for example, the memory controller 18, may provide various signals to the memory device 10 to facilitate the transmission and receipt of data to be written to or read from the memory device 10.

As will be appreciated, the command interface 14 may include a number of circuits, such as a clock input circuit 24 and a command address input circuit 26, for instance, to ensure proper handling of the received signals. The command interface 14 may receive one or more clock signals from an external device, such as a processor or controller (for example, the memory controller 18 or a register clock driver (RCD) for a dual inline memory module), for example, at the clock input circuit 24. Likewise, the command interface 14 receives commands (e.g., read command, write command, etc.), which may be entered on the positive edges of a clock signal as well as data, which typically is transmitted or received on both positive and negative clock edges. In some embodiments, the commands can be of a variable clock length (e.g., one or more clocks are used to receive the commands).

The clock input circuit 24 receives the one or more clock signals and transmits an internal clock signal CLK therefrom (e.g., based upon the received one or more clock signals). In some embodiments, the internal clock signal CLK is supplied to an internal clock generator 28, such as a delay locked loop circuit (DLL) along path 30. The internal clock generator 28 generates a phase controlled internal clock signal (LCLK) based on the received internal clock signal CLK. In some embodiments, for example, clock adjustment circuitry 30 may operate to adjust the internal clock signal CLK to have a different frequency as the phase controlled internal clock signal LCLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 28 over the bus 36 to coordinate generation of the phase controlled internal clock signal LCLK.

Further, the command decoder 32 may decode commands, such as read commands, write commands, mode-register set commands, activate commands, etc., and provide access to a particular memory partition 12 corresponding to the command, via bus path 38. As will be appreciated, the memory device 10 may include various other decoders, such as row decoders and column decoders, to facilitate access to the memory partitions 12. In one embodiment, each memory partition 12 includes a control block 40 which provides the necessary decoding (e.g., row decoder and column decoder), as well as other features, such as timing control and data control, to facilitate the execution of commands to and from the memory partitions 12.

The memory device 10 executes operations, such as read commands and write commands, based on the command/ address signals received from an external device, such as a processor and/or by the memory controller 18. In one embodiment, command/address signals are clocked to the command interface 14 using clock signals. The command interface 14 may include the command address input circuit

26, which is configured to receive and transmit the commands to provide access to the memory partitions 12, through the command decoder 32, for instance. In addition, the command interface 14 may receive memory select signals that enable the memory device 10 to process commands on the incoming command/address signals. Access to specific memory partitions 12 within the memory device 10 can be encoded in the commands.

In addition, the command interface 14 may be configured to receive a number of other command signals. For instance, a reset command may be used to reset the command interface 14, status registers, state machines and the like, during power-up for instance. Various signals to facilitate testing of the memory device 10 may be provided, as well. For instance, the testing signals may be used to place the memory device 10 into a test mode for connectivity testing. The command interface 14 may also be used to provide an alert signal or another alarm signal to the system processor or controller for certain errors that may be detected. However, in some embodiments, the I/O interface 16 may additionally or alternatively be utilized to transmit an alert signal, for example, a thermal alert.

Data may be sent to and from the memory device 10, utilizing the command and clocking signals discussed above, by transmitting and receiving data signals through the I/O interface 16. More specifically, the data may be sent to or retrieved from the memory partitions 12 over the data path 42, which includes a plurality of bi-directional data buses. Data I/O signals, are generally transmitted and received in one or more bi-directional data busses to and from the I/O interface 16. For certain memory devices, such as a DDR5 SDRAM memory device, the I/O signals may be divided into upper and lower bytes; however, such segmentation is not required for other memory device types.

As will be appreciated, various other components such as power supply circuits (for receiving external VDD and VSS signals), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

The memory device 10 may benefit from having signals that are scaled-up. For example, memory signals in the memory partitions 12 being transmitted to output drivers may be scaled-up prior to being received by the output drivers. Similarly, the CLK and/or the LCLK may similarly be scaled-up prior to transmission to various elements of the memory device 10. One technique to provide scaling to the signals of the memory device 10 (or, for example, another electronic device in which similar scaling of signals is desirable) is to implement an inverter chain along the respective signal path. Examples of potential inverter chains that can be utilized are described below.

Figure 2:
FIG. 2 illustrates a block diagram of a first embodiment of an inverter chain of the memory device of FIG. 1, according to an embodiment of the present disclosure.
Figure 2:
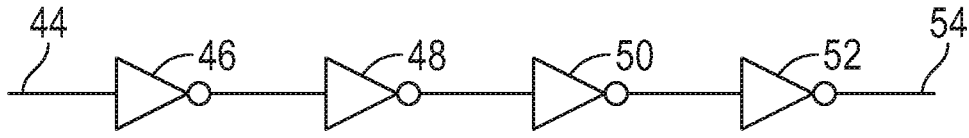

FIG. 2 illustrates an embodiment of an inverter chain 42 that operates to scale-up a signal received at input 44 (e.g., a pin, connection, or a line). The inverter chain 42, as illustrated, includes inverter 46, inverter 48, inverter 50, and inverter 52 disposed in series. While four inverters 46, 48, 50, and 52 are illustrated, it should be noted that a greater number or a lesser number of inverters can be utilized in the inverter chain 42. Moreover, it should be noted that an even number of inverters 46, 48, 50, and 52 are illustrated so that any signal received at input 44 and transmitted at output 54 (e.g., a pin, connection, or a line) is not inverted. However, in some embodiments, odd numbers of inverters can be utilized in the inverter chain 42, for example, when an inverted output signal at output 54 is desired.

As illustrated, inverter chain 42 is a scaling inverter chain with a respective fanout at output 54. The fanout at output 54 can be, for example, an amount of drive or slewing current at output 54 versus the capacitance driven at the input 44. The number and sizes of the inverters 46, 48, 50, and 52 can be chosen to generate a desired drive or slewing current at output 54 for a given capacitance at input 44 and in some embodiments, the fanout of each of the inverters 46, 48, 50, and 52 can be evenly distributed across the inverters 46, 48, 50, and 52. Alternatively, the fanout of the inverters 46, 48, 50, and 52 can, for example, increase for each of the inverters 46, 48, 50, and 52 in the inverter chain 42. In this manner, the inverter chain 42 operates to scale-up the signal received at input 44 (i.e., through the increase in capacitance drive-ability provided by the inverter chain 42). However, when scaling-up the signal received at input 44, there may be an accompanying amount of signal degradation in the resultant signal generated and transmitted from output 54. These errors may include, for example, inter symbol interference (ISI) errors in the signal and/or other errors. Accordingly, in some embodiments, a feedback path may be introduced into the inverter chain to reduce signal errors, such as ISI.

Figure 3:
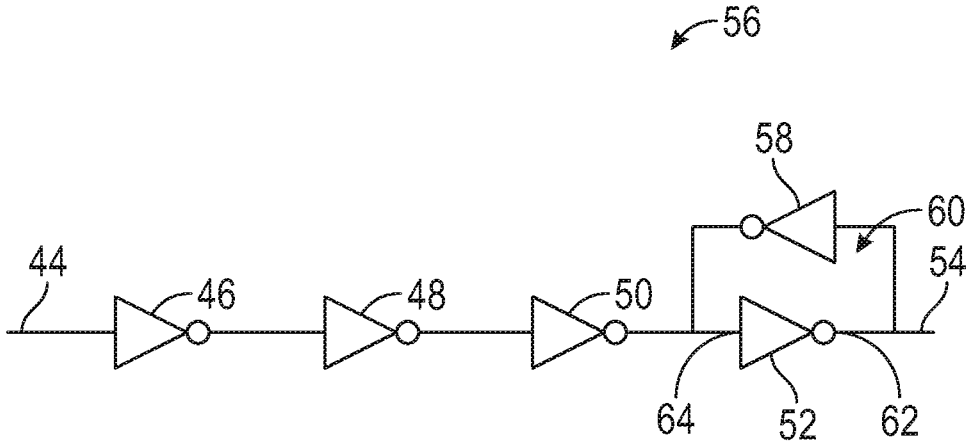
FIG. 3 illustrates a block diagram of second embodiment of an inverter chain of the memory device of FIG. 1, according to an embodiment of the present disclosure.

FIG. 3 illustrates an embodiment of an inverter chain 56 that operates similarly to the inverter chain 42 in that the inverter chain 56 operates to scale-up a signal received at input 44. The inverter chain 56, as illustrated, includes inverter 46, inverter 48, inverter 50, and inverter 52 disposed in series and while four inverters 46, 48, 50, and 52 are illustrated, it should be noted that a greater number or a lesser number of inverters can be utilized in the inverter chain 56. Moreover, it should be noted while an even number of inverters 46, 48, 50, and 52 are illustrated so that any signal received at input 44 and transmitted at output 54 is not inverted, in some embodiments, odd numbers of inverters can be utilized in the inverter chain 56, for example, when an inverted output signal at output 54 is desired.

As illustrated, inverter chain 56 is a scaling inverter chain with having a respective fanout at output 54 whereby the number and sizes of the inverters 46, 48, 50, and 52 can be chosen to generate a desired capacitance drive-ability at output 54 for a given capacitance at input 44. Additionally, in some embodiments, the fanout of each of the inverters 46, 48, 50, and 52 can be evenly distributed across the inverters 46, 48, 50, and 52. Alternatively, the fanout of the inverters 46, 48, 50, and 52 can, for example, increase for each of the inverters 46, 48, 50, and 52 in the inverter chain 56. In this manner, the inverter chain 42 operates to scale-up the signal received at input 44 (i.e., through the increase in capacitance provided by the inverter chain 56).

Moreover, inverter chain 56 additionally includes another inverter 58 disposed in feedback path 60. Feedback path 60, as illustrated, is coupled to an output 62 of the final inverter (i.e., inverter 52) in the inverter chain 56 and to an input 64 of that same final inverter (i.e., inverter 52) with inverter 58 disposed therebetween. In some embodiments, the size of the inverter 58 can be chosen based upon, for example, an amount of desired error reduction in the signal output from output 54, area constraints, and/or other considerations. However, the size of the inverter 52 coupled to the feedback path 60 and/or the fanout of the inverter 58 can be chosen based upon the fanout of the inverter 52 coupled to the feedback path 60. That is, inverter 58 can be chosen according to a scaling factor applied to the inverter 52 coupled to the feedback path 60. In operation, selection and utilization of the inverter 58 in the feedback path 60 can operate to reduce errors in the signal output from output 54.

As illustrated, inclusion of the feedback path 60 at a node (e.g., at the output 62 of inverter 52) reinforces the signal input to inverter 52 and the inverter chain 56 can operate to provide scale-up of a signal with reduction in associated errors. However, additional embodiments may be utilized to achieve a similar or better result with respect to error reduction in association with a scale-up path.

Figure 4:
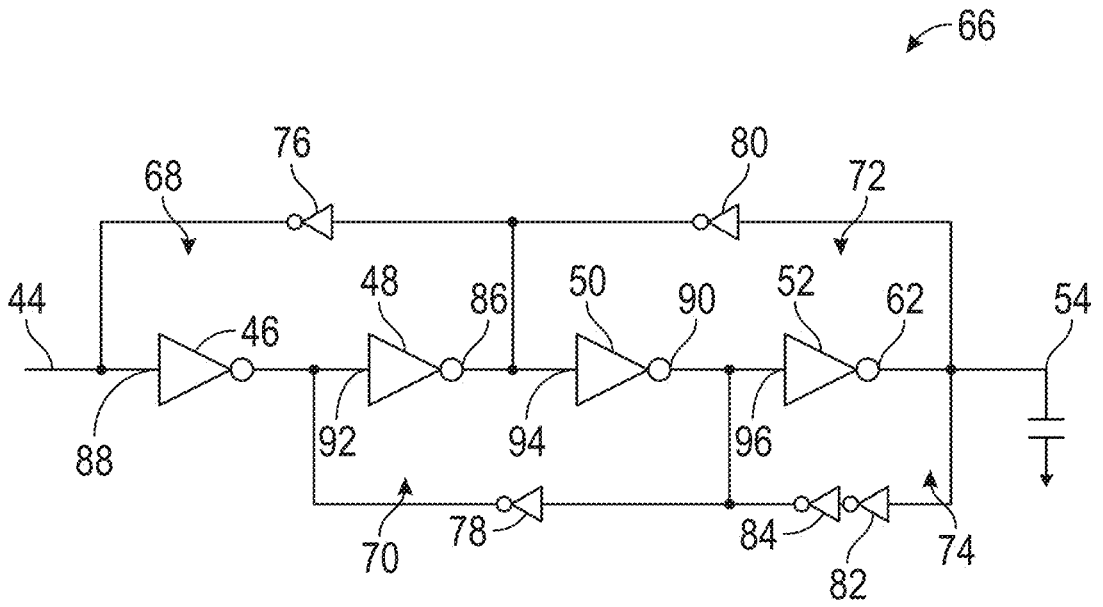
FIG. 4 illustrates a block diagram of third embodiment of an inverter chain of the memory device of FIG. 1, according to an embodiment of the present disclosure.

FIG. 4 illustrates an embodiment of an inverter chain 66 that operates similarly to the inverter chain 56 in that the inverter chain 66 operates to scale-up a signal received at input 44. The inverter chain 66, as illustrated, includes inverter 46, inverter 48, inverter 50, and inverter 52 disposed in series and while four inverters 46, 48, 50, and 52 are illustrated, it should be noted that a greater number or a lesser number of inverters can be utilized in the inverter chain 66. Moreover, it should be noted while an even number of inverters 46, 48, 50, and 52 are illustrated so that any signal received at input 44 and transmitted at output 54 is not inverted, in some embodiments, odd numbers of inverters can be utilized in the inverter chain 66, for example, when an inverted output signal at output 54 is desired.

As illustrated, inverter chain 66 is a scaling inverter chain with having a respective fanout at output 54 whereby the number and sizes of the inverters 46, 48, 50, and 52 can be chosen to generate a desired capacitance drive-ability at output 54 for a given capacitance at input 44. Additionally, in some embodiments, the fanout of each of the inverters 46, 48, 50, and 52 can be evenly distributed across the inverters 46, 48, 50, and 52. Alternatively, the fanout of the inverters 46, 48, 50, and 52 can, for example, increase for each of the inverters 46, 48, 50, and 52 in the inverter chain 66. In this manner, the inverter chain 42 operates to scale-up the signal received at input 44 (i.e., through the increase in capacitance provided by the inverter chain 66).

Inverter chain 66 additionally includes feedback path 68, feedback path 70, feedback path 72, and feedback path 74 whereby feedback path 68 includes inverter 76 disposed therein, feedback path 70 includes inverter 78 disposed therein, feedback path 72 includes inverter 80 disposed therein, and feedback path 74 includes inverter 82 and inverter 84 disposed therein. Additionally, feedback path 68 is coupled to output 86 of inverter 48 and input 88 of inverter 46. Feedback path 70 is coupled to output 90 of inverter 50 and input 92 of inverter 48. Feedback path 72 is coupled to output 62 of inverter 52 and input 94 of inverter 50 and feedback path 74 is coupled to output 62 of inverter 52 and input 96 of inverter 52. In this manner, each of feedback path 68, feedback path 70, feedback path 72, and feedback path 74 operates as a part of a distributed feedback along inverter chain 66.

The inclusion of feedback path 68, feedback path 70, feedback path 72, and feedback path 74 imposes a de-emphasis behavior in the inverter chain 66 (i.e., de-emphasizing the low frequency content of the signal transmitted from output 54 while equalizing or otherwise improving the signal quality of the signal transmitted from output 54. This imposition of the dew-emphasis behavior in the inverter chain 66 is accomplished via inclusion of an odd number of inversions in the feedback path 68, the feedback path 70, the feedback path 72, and the feedback path 74.

Inverter chain 66 can be utilized, for example, in the memory device 10 to couple memory signals having been transmitted to gates with a reduced size (i.e., to increase the memory density available for a given amount of space available) to scale-up the signals from the memory gates to an output driver to drive a signal from, for example, the memory device 10 to another chip. In such an embodiment, a large number of inverters may be used (e.g., ten or more inverters each with the size characteristics of inverters 46, 48, 50, and 52) in a pre-driver chain to, for example, drive a load coupled to the pre-driver chain. Similar examples can be applied to clock transmission.

By distributing a feedback mechanism (e.g., using multiple feedback loops or paths, such as, feedback path 68, feedback path 70, feedback path 72, and feedback path 74) using inverter chain 66 as the above described pre-driver chain, the number of gates in the pre-driver chain can be reduced (i.e., inverter chain 66 can operate with inverters 46, 48, 50, and 52 in place of a greater number of additional inverters in series with inverters 46, 48, 50, and 52 in the inverter chain 66) through the use of the feedback elements (e.g., inverter 76, inverter 78, inverter 80, inverter 82, and inverter 84) in feedback path 68, feedback path 70, feedback path 72, and feedback path 74. Additionally, the feedback elements (e.g., inverter 76, inverter 78, inverter 80, inverter 82, and inverter 84) are physically smaller in size than the chain inverters (e.g., inverters 46, 48, 50, and 52 and any additional inverters in series therewith that would be utilized). Thus, by utilizing the feedback elements (e.g., inverter 76, inverter 78, inverter 80, inverter 82, and inverter 84), chain inverters (e.g., inverters 46, 48, 50, and 52 and any additional inverters in series therewith) can be removed, leading to a reduction in overall footprint of the inverter chain 66 relative to an inverter chain taking a form similar to that illustrated in either of FIG. 2 or FIG. 3.

Additionally, removal of chain inverters reduces delay (caused by the chain inverters) from the path through the chain inverters as well as removes buffer stages from the path through the chain inverters. Thus, use of the feedback elements (e.g., inverter 76, inverter 78, inverter 80, inverter 82, and inverter 84) not just reduces the silicon area (i.e., footprint) of the inverter chain 66 relative to an inverter chain taking a form similar to that illustrated in either of FIG. 2 or FIG. 3, but use of the distributed feedback mechanism (e.g., the feedback elements inverter 76, inverter 78, inverter 80, inverter 82, and inverter 84 and their respective feedback path 68, feedback path 70, feedback path 72, and feedback path 74) also leads to speed increases in the inverter chain 66 relative to an inverter chain taking a form similar to that illustrated in either of FIG. 2 or FIG. 3 as well as power savings due to the removal of the larger chain inverters and replacement thereof with smaller feedback elements (e.g., inverter 76, inverter 78, inverter 80, inverter 82, and inverter 84) which draw less power than the larger chain inverters. Further, the removal of stages along the forward path reduces the sensitivity to power supply fluctuation and temperature drift, since those sensitivities tend to correlate with the time delay through any particular circuit.

In the chain inverter 66 illustrated in FIG. 4, there is a fanout (e.g., an amplification factor relative to a next stage) for the chain inverters 46, 48, 50, and 52. As previously noted, the fanout may be constant (e.g., four). Thus, for example, inverter 46 may be a 1× inverter, inverter 48 may be a 4× inverter, inverter 50 may be a 16× inverter, and inverter 52 may be a 64× with respect to the capacitance so that the resultant capacitance gain at the output 54 relative to the input 44 is 64 times the size (i.e., the capacitance at output 54 is 64 times as large as the capacitance at input 44). The feedback elements (e.g., inverter 76, inverter 78, inverter 80, inverter 82, and inverter 84) scale with the same growth as their associated chain inverters 46, 48, 50, and 52. Thus inverter 76 is a 1× inverter, inverter 78 is a 4× inverter, inverter 80 is a 16× inverter, inverter 82 is a 16× inverter, and inverter 84 is a 64× inverter. However, each of the inverter 76, inverter 78, inverter 80, inverter 82, and inverter 84 is associated with a feedback scale factor that results in each of the inverter 76, inverter 78, inverter 80, inverter 82, and inverter 84 being at least, for example, 10 times smaller, 20 times smaller, 30 times smaller, or another value than their associated chain inverter 46, 48, 50, and 52 (e.g., the chain inverter 46, 48, 50, and 52 in respective feedback path 68, feedback path 70, feedback path 72, and feedback path 74 associated with each of inverter 46, inverter 48, inverter 50, and inverter 52). Flexibility in fan-out and feedback scaling from stage to stage can be advantageous, for example, when interconnects contribute non-uniformly to the capacitance seen at any stage. That is, while some embodiments a fixed fan-out scaling (e.g., four times larger) through the forward chain and a fixed feedback scaling (e.g., ten times smaller) throughout the chain may be employed, the actual feedback scaling from feedback path to feedback path can, for example, be varied.

As additionally illustrated, each of the feedback path 68, feedback path 70, feedback path 72, and feedback path 74 has an odd number (i.e., three) of inverters therein. Feedback path 68 includes inverter 46, inverter 48, and inverter 76. Feedback path 70 includes inverter 48, inverter 50, and inverter 78. Feedback path 72 includes inverter 50, inverter 52, and inverter 80. Finally, feedback path 74 includes (in contrast) includes three inverters, but only one thereof is one main line inverter as inverter 52 with the two remaining inverters as the two feedback inverters (i.e., inverter 82, and inverter 84). In this manner, in some embodiments, each of the feedback each of the feedback path 68, feedback path 70, feedback path 72, and feedback path 74 operates in a manner similar to a ring oscillator. Additionally, it should be noted that in some embodiments, feedback inverter 82 and feedback inverter 84 scale up, which can be beneficial as it reduces (or minimizes) the capacitive loading imposed on the output node by the addition of the feedback path, while still providing full feedback strength at the input of the final stage (i.e., the input of inverter 52).

Furthermore, while each of the feedback path 68, feedback path 70, feedback path 72, and feedback path 74 includes number (i.e., three) of inverters therein other odd numbers (e.g., one, five, etc.) are envisioned. Likewise, in some embodiments, one or more of inverter 46, inverter 48, inverter 50, and inverter 52 can have no corresponding feedback path associated therewith while the remaining have an odd number of inverters associated therewith. Additionally, in some embodiments, an odd number of feedback elements can be disposed at a single node between any of the invertor 46, the inverter 48, the inverter 50, and the inverter 52 (e.g., the chain inverters) without including any of the chain inverters in the feedback path.

In one embodiment whereby there are an odd number of inverters for any given feedback path 68, feedback path 70, feedback path 72, and feedback path 74, the respective feedback elements (e.g., inverter 76, inverter 78, inverter 80, inverter 82, and inverter 84) operate to generate a signal that opposes the underlying received signal at the respective feedback path 68, feedback path 70, feedback path 72, and feedback path 74. This causes the single amplitude received at each of inputs 88, 92, 94, and 96 to be reduced (due to the operation of the inverter 76, inverter 78, inverter 80, inverter 82, and inverter 84), in proportion to the size of the inverter 76, inverter 78, inverter 80, inverter 82, and inverter 84 to their associated chain inverter 46, 48, 50, and 52. This results in a de-emphasis behavior in the inverter chain 66 (e.g., de-emphasizing the low frequency content of the signal transmitted from output 62 while maintaining the high frequency content of the signal to counter the typical roll off of the bandwidth limited circuit elements of the inverter chain 66). But unlike chain inverter 56, the de-emphasis of behavior in the inverter chain 66 is distributed across all of the inverter chain 66 instead of only at one single node, which may operate to improve the voltage margin along the entire chain inverter 66 and does not require a large error correction by one inverter at a single node.

As noted above, the feedback elements (e.g., inverter 76, inverter 78, inverter 80, inverter 82, and inverter 84) can be physically smaller in size relative to their associated chain inverter 46, 48, 50, and 52. However, in some embodiments, this may lead to issues regarding implementation of an inverter (e.g., inverter 76) in the first feedback loop (i.e., feedback loop 68); namely that the required size for inverter 76 may be unrealizable. Accordingly, another embodiment of an embodiment of an inverter chain that operates similarly to the inverter chain 56 of FIG. 4 is described below.

Figure 5:
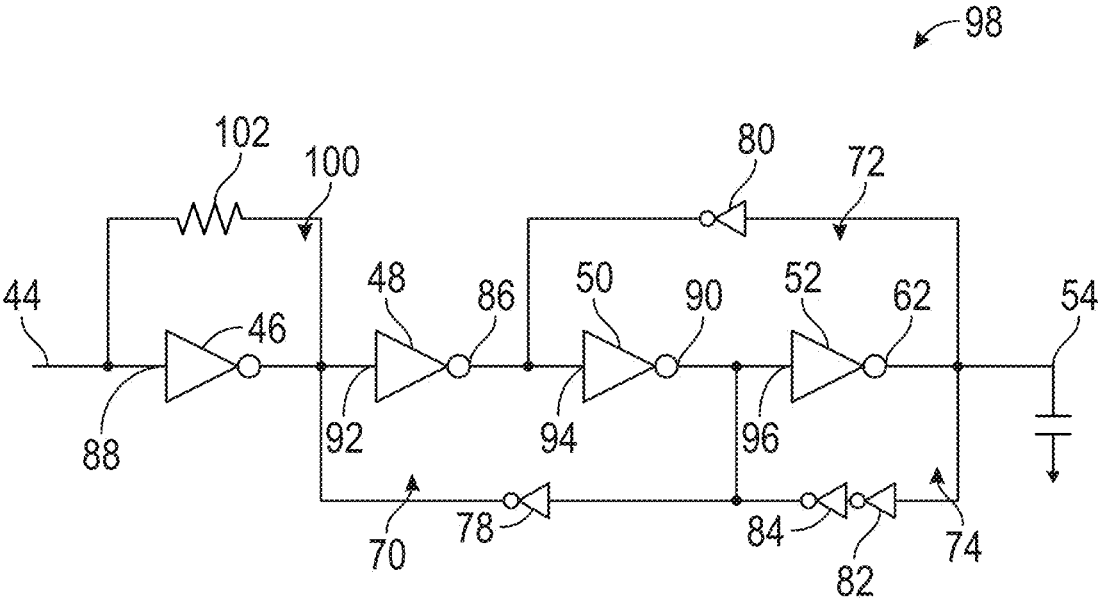
FIG. 5 illustrates a block diagram of fourth embodiment of an inverter chain of the memory device of FIG. 1, according to an embodiment of the present disclosure.

FIG. 5 illustrates an embodiment of an inverter chain 98 that operates similarly to the inverter chain 66 of FIG. 4 in that the inverter chain 98 operates to scale-up a signal received at input 44. However, in contrast to the inverter chain 66 of FIG. 4 that includes feedback path 68 having inverter 76 therein, inverter 98 of FIG. 5 includes a feedback path 100 inclusive of resistor 102. This may occur, for example, when the required size for inverter 76 may be unrealizable, e.g., smaller than allowed for in a given set of process design specifications. In this situation, substitution of the resistor 102 in place of a feedback inverter in the first feedback loop (e.g., feedpack path 100) may be implemented. In some embodiments, resistor 102 may have a resistance of, for example, approximately 1000 Ohms, 2000 Ohms, 3000 Ohms, 5000 Ohms, or another value, and the resistor 102 may operate to secure similar de-emphasized benefit in the small early stages of the main path (i.e., along inverters 46, 48, 50, and 52).

Additionally, a similar replacement may be additionally implemented in another feedback loop (e.g., replacing inverter 78 in feedback path 70 with a resistor, similar to feedback path 100). In this additional embodiment, each resistor is associated with a particular stage, so if two stages receive resistor-feedback, then there are two resistors with the shared node connected between the mainline inverter stages and the opposite ends of the resistors connected to the input of the first stage and the output of the second stage, respectively. Furthermore, in some embodiments, transistor-based passgates can be connected in series with the resistor feedback in order to remove them from the main path when the path is powered down. This can assist in minimizing leakage currents in the power-down state. In this manner, use of resistors operates similarly to how the feedback inverters of FIG. 4 are implemented as, for example, tri-state-able inverters (e.g., so that they too may be selectively disabled as needed).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112 (f). However, for any claims containing elements designated in any other manner, it is intended that such elements are not to be interpreted under 35 U.S.C. 112 (f).

What is claimed is:

1. A device, comprising:
   a signal path including a plurality of inverters connected in series which comprises:
      a first inverter having a first input and a having first output;
      a second inverter having a second input coupled to the first output of the first inverter and having a second output; and
      a third inverter having a third input coupled to the second output of the second inverter and having a third output;
   a first feedback path connecting the second output of the second inverter to the first input of the first inverter, the first feedback path including a fourth inverter; and
   a second feedback path connecting the third output of the third inverter to the second input of the second inverter, the second feedback path including a fifth inverter.

2. The device of claim 1, wherein a size of the fourth inverter is based upon a scaled size of the first inverter.

3. The device of claim 1, wherein a first size of the fourth inverter is at least thirty times smaller than a second size of the first inverter.

4. The device of claim 1, wherein a size of the fifth inverter is based upon a scaled size of the second inverter.

5. The device of claim 1, wherein a first size of the fifth inverter is at least thirty times smaller than a second size of the second inverter.

6. The device of claim 1, wherein the plurality of inverters connected in series comprises a sixth inverter having a fourth input coupled to the third output of the third inverter and having a fourth output.

7. The device of claim 6, comprising a third feedback path connecting the fourth output of the sixth inverter to the third input of the third inverter, the third feedback path including a seventh inverter.

8. The device of claim 7, wherein a size of the seventh inverter is based upon a scaled size of the third inverter.

9. The device of claim 7, wherein a first size of the seventh inverter is at least thirty times smaller than a second size of the third inverter.

10. The device of claim 7, comprising a fourth feedback path connecting the fourth output of the sixth inverter to the fourth input of the sixth inverter, the fourth feedback path including an eighth inverter and a ninth inverter.

11. The device of claim 10, wherein a size of the eighth inverter is based upon a scaled size of the sixth inverter.

12. The device of claim 10, wherein a first size of the eighth inverter is at least thirty times smaller than a second size of the sixth inverter.

13. The device of claim 10, wherein a size of the ninth inverter is based upon a scaled size of the sixth inverter.

14. The device of claim 10, wherein a first size of the ninth inverter is at least thirty times smaller than a second size of the sixth inverter.

15. A device, comprising:

a signal path including a plurality of inverters connected in series to define a plurality of intermediate nodes each disposed between corresponding adjacent two inverters of the plurality of inverters; and a plurality of feedback paths each connecting a corresponding one node of the plurality of intermediate nodes to another node of the plurality of intermediate nodes, each of the plurality of feedback paths including at least one inverter as a feedback inverter;

wherein each loop path closed with a corresponding portion of the signal path and a corresponding one of the plurality of feedback paths includes odd number of inverters.

16. The device of claim 15, wherein a size of the feedback inverter in each loop path is based upon a second size of at least one inverter in the loop path.

17. The device of claim 15, wherein a size of each feedback inverter in each loop path is less than a second size of at least inverter of in the loop path.

18. The device of claim 15, wherein each inverter of the plurality of inverters in the signal path comprises a common fanout value.

19. The device of claim 15, comprising a first inverter disposed in series with the plurality of inverters, wherein the first inverter comprises a first input and a first output, wherein the first output of the first inverter is coupled to a second input of a second inverter of the plurality of inverters connected in series; and an initial feedback path connecting the first output of the first inverter to the first input of the first inverter, the initial feedback path including a resistor.

20. A method, comprising:

transmitting a signal along a signal path comprising a plurality of inverters connected in series to increase a capacitance drive-ability of the signal, wherein a first inverter of the plurality of inverters comprises a first input and first output, wherein a second inverter of the plurality of inverters comprises a second input coupled to the first output of the first inverter and the second inverter comprises a second output, wherein a third inverter of the plurality of inverters comprises a third input coupled to the second output of the second inverter and the third inverter comprises a third output;

feeding back, along a first feedback path including a fourth inverter and connecting the second output of the second inverter to the first input of the first inverter, a first feedback signal from the second output of the second inverter to the first input of the first inverter; and feeding back, along a second feedback path including a fifth inverter and connecting the third output of the third inverter to the second input of the second inverter, a second feedback signal from the third output of the third inverter to the second input of the second inverter.

* * * * *